United States Patent [19]

Bodeep et al.

[11] Patent Number: 5,798,858
[45] Date of Patent: Aug. 25, 1998

[54] METHOD AND APPARATUS FOR REDUCING ADVERSE EFFECTS OF OPTICAL BEAT INTERFERENCE IN OPTICAL COMMUNICATION SYSTEMS

[75] Inventors: George E. Bodeep, Lawrenceville, Ga.; Thomas Edward Darcie, Middletown, N.J.; Xiaolin Lu, Matawan, N.J.; Sheryl Leigh Woodward, Holmdel, N.J.

[73] Assignee: Lucent Technologies Inc., Murray Hill, N.J.

[21] Appl. No.: 595,110

[22] Filed: Feb. 1, 1996

[51] Int. Cl.$^6$ .................................................. H04B 10/06
[52] U.S. Cl. .......................... 359/191; 359/181; 359/161; 359/133
[58] Field of Search .................................. 359/133, 161, 359/180, 181, 182, 173, 191, 188; 372/6, 26, 32, 28

[56] References Cited

U.S. PATENT DOCUMENTS

| | | |
|---|---|---|
| 5,295,209 | 3/1994 | Huber .................................. 372/26 |
| 5,373,385 | 12/1994 | Darcie et al. ...................... 3598/162 |
| 5,589,970 | 12/1996 | Lyu et al. ............................ 359/133 |

OTHER PUBLICATIONS

N. Hayashi et al., "Eight Channel Upstream Transmission Demonstration for Subcarrier Multiple Access Networks," Tenth Annual International Conference on Integrated Optics and Optical Fibre Communication, Technical Digest, vol. 4, Jun. 30, 1995.

S.L. Woodward et al., "Uncooled Fabry–Perot Lasers for QPSK Transmission," IEEE Photonics Technology Letters, vol. 7, pp. 558–560, May 1995.

R.D. Feldman et al., "Operation of a Subcarrier Multiple Access Passive Optical Network with Multimode Lasers in the Presence of Optical Beat Interference," paper TuQ5, Optical Fiber Communication Conference, San Diego, CA, 1995.

X. Lu et al., "Clipping Induced Impulse Noise and Its Effect on Bit-Error Performance in AM–VSB/64QAM Hybrid Lightwave Systems," IEEE Photonics Technology letters, vol. 6, pp. 866–868, Jul. 1994.

T.H. Wood et al., "Operation of Passive Optical Network with Subcarrier Multiplexing in the Presence of Optical Beat Interference," J. Lightwave Technol., vol. LT–11, No. 10, pp. 1632–1640, Oct. 1993.

C. Desem, "Measurement of Optical Interference Due to Multiple Optical Carriers in Subcarrier Multiplexing," IEEE Photonics Technology Letters, vol. 3, pp. 387–389, Apr. 1991.

C. Desem, "Optical Interference in Lightwave Subcarrier Multiplexing Systems Employing Multiple Optical Carriers," Electronic Letters, vol. 24, No. 1, pp. 50–52, Jan. 1988.

T.E. Darcie, "Subcarrier Multiplexing for Multiple–Access Lightwave Networks," J. Lightwave Technol. vol. LT–5, No. 8, pp. 1103–1110, Aug. 1987.

T. Okoshi et al., "Novel Method for High Resolution Measurement of Laser Output Spectrum," Electronic Letters, vol. 16, No. 16, pp. 630–631, Aug. 1980.

*Primary Examiner*—Rafael Bacares

[57] ABSTRACT

A method and apparatus for reducing noise in optical communication systems, wherein the frequency of light output from a signal laser is modulated or dithered to broaden the optical spectrum of the signal laser. The broadening allows error-free data transmission within signal bands, despite the presence of optical beat interference. Different dithering tones are emitted by each laser in the network. The dithering tone for each signal laser in an optical network is chosen so that distortion resulting from the dithering tone falls outside the signal bands.

24 Claims, 3 Drawing Sheets

METHOD AND APPARATUS FOR REDUCING ADVERSE EFFECTS OF OPTICAL BEAT INTERFERENCE IN OPTICAL COMMUNICATION SYSTEMS

BACKGROUND OF THE INVENTION

1. Field of the Invention

The present invention relates generally to the field of optical communications systems and more particularly to a method and apparatus for reducing adverse effects of optical beat interference in lightwave transmission systems.

2. Background of the Invention

Over the past decade, the popularity of passive optical networks (PONs) has grown. By sharing the cost of a "feeder" among many users, PONs promise to be more economical than other fiber-to-the-curb (FTTC) architectures. Subcarrier-multiplexed (SCM) PONs, where each channel is allocated a different RF subcarrier, have been proposed due to the ease with which user channels can be independently accessed. Unfortunately, the performance of a SCM-PON can be seriously degraded by optical-beat interference (OBI).

OBI occurs when light from two sources is detected in a photodetector, creating beat signals at a "difference" frequency. The result is that phase noise is converted into intensity noise. Unlike time-division multiple access (TDMA) systems, where careful timing prevents light from different lasers from arriving at a receiver at the same time, in a SCM-PON, light from multiple lasers will arrive at the receiver simultaneously. If two of these lasers have optical frequencies differing by a subcarrier frequency of one of the channels, then OBI can severely degrade the signal-to-noise ratio (SNR) of that channel. See, for example, Wood and Shankaranarayanan, "Operation of a Passive Optical Network with Subcarrier Multiplexing in the Presence of Optical Beat Interference," *J. Lightwave Technology*, vol. LT-11, no. 10, pp. 1623–1640, October 1993. Choosing lasers so that their frequencies do not coincide is difficult when uncooled lasers are to be used, as temperature variations may cause the wavelength of each laser to change by well over 20 nanometers.

To reduce the effects of OBI, it is advantageous to broaden the optical spectrum of the transmitter's light source because noise in an RF channel will be inversely proportional to the optical bandwidth (assuming that the bandwidth of the RF channel is much less than the optical bandwidth). When each laser carries only a single channel, overmodulating the channel (optical modulation depth, m>1) can sufficiently broaden the optical spectrum of a distributed feedback (DFB) laser so that error-free transmission can be achieved even in the presence of OBI. (Wood and Shankaranarayanan, "Operation of a Passive Optical Network with Subcarrier Multiplexing in the Presence of Optical Beat Interference"). Error-free transmission of a frequency shift keyed (FSK) signal has been demonstrated using Fabry-Perot lasers, where a signal laser was 13 dB weaker than the combined power of interfering lasers. See R. D. Feldman, T. H. Wood and R. F. Austin, "Operation of a Subcarrier Multiple Access Passive Optical Network with Multimode Lasers in the Presence of Optical Beat Interference," paper TuQ5, Optical Fiber Communication Conference, San Diego, Calif., 1995. When an amplified, light emitting diode (LED) is used, there is less than a 1 dB penalty from OBI because of the LED's broad optical spectrum. Unfortunately, LEDs have a limited modulation bandwidth, which limits the subcarrier frequencies that can be used.

In a system where each remote optical network unit (ONU) serves more than one home, each laser may carry multiple RF channels, with each channel serving a different user. In this scenario, over-modulating the data channels may not be an acceptable option because distortion or clipping induced noise will fall within the signal band, and may cause errors.

The present invention expands upon the method and apparatus for reduction of optical interference set forth in U.S. Pat. No. 5,373,385 to Darcie, et al. Accordingly, U.S. Pat. No. 5,373,385 is incorporated into this document by reference.

SUMMARY OF THE INVENTION

In a PON system wherein each laser carries multiple RF channels, the present invention uses out-of-band dithering tones to broaden the laser's optical spectra sufficiently so that transmission is error-free despite the presence of OBI. The optical modulation depth (OMD) of each dithering tone is greater than 1. In addition, the frequency of each dithering tone is chosen so that distortion from each dithering tone does not fall within the signal band, and therefore does not cause errors within the signal band. Different dithering tones are used by each laser in the PON transmitting information upstream.

BRIEF DESCRIPTION OF THE DRAWINGS

The invention will be described in detail with reference to the following drawings, wherein like reference characters refer to like elements and.

DETAILED DESCRIPTION OF THE INVENTION

Figure 1:
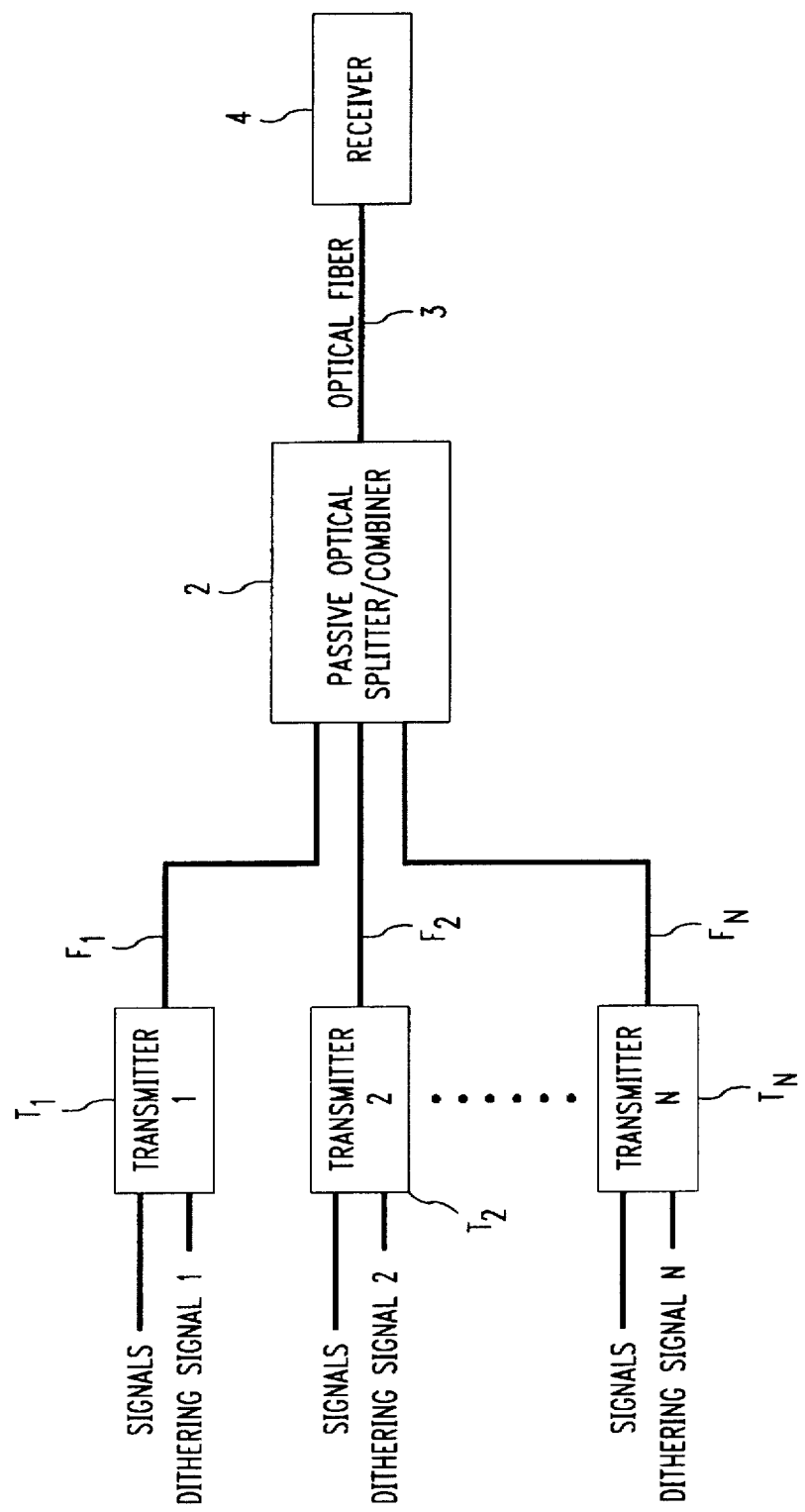
FIG. 1 shows an optical transmission system.

FIG. 1 shows an optical transmission system according to the present invention, wherein data signals and dithering signals are input to transmitters T. The outputs of the transmitters T are connected to a passive optical splitter/combiner 2 via optical fibers F. The passive optical splitter/combiner 2 is connected to a receiver 4 via an optical fiber 3.

Dithering tones are generated by modulating the wavelength or optical frequency of light emitted from lasers used to transmit signals in a PON. Optical frequency modulation may be accomplished by appropriate use of techniques well known in the art. As described in U.S. Pat. No. 5,373,385, there are various ways to modulate the optical frequency of a laser. For example, where the laser is a semiconductor laser, a phenomenon known within the art as "chirp" may be used to systematically modulate the optical frequency of a laser. Chirp is the incidental modulation of the light's wavelength or frequency that occurs during direct intensity modulation of a light source. In other words, the wavelength of light output from a laser varies with the amount of electrical current provided to the laser. The optical frequency can also be modulated by systematically varying the operating temperature of the laser, or by using an external modulator.

Figure 2A:
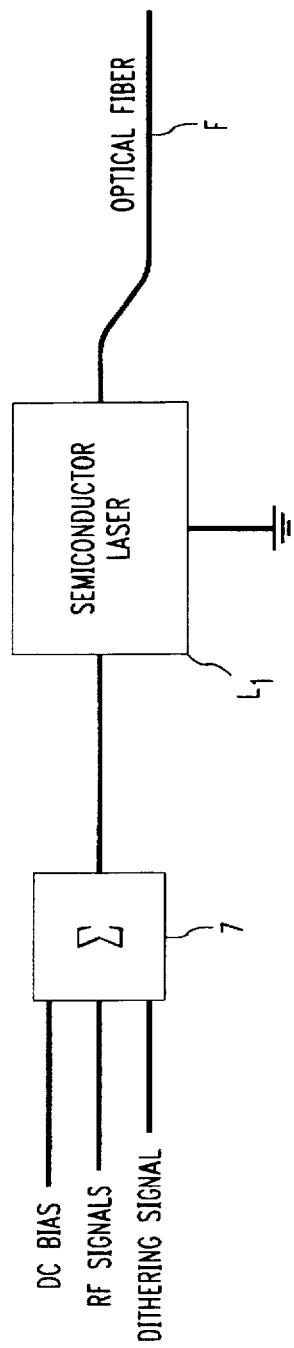
FIG. 2a shows one embodiment of one of the transmitters of FIG. 1.

In an illustrative embodiment of the invention using the system shown in FIG. 1, each transmitter T includes a semiconductor Fabry-Perot laser, as shown in FIG. 2a. FIG. 2a shows a semiconductor Fabry-Perot laser transmitter having an electrical combiner 7. The electrical combiner 7 combines the DC bias, RF signals, and dithering signal for input to the laser $L_1$. The output of the laser $L_1$ is emitted into the optical fiber F. Dithering signals input to the lasers cause the lasers' optical frequency to vary. In this way the lasers emit dithering tones. The optical modulation depth (OMD) of each dithering tone on each of the signal lasers is 1.4. Note that because the modulation depth is greater than 1.0, the laser will be driven below threshold, i.e. will be turned completely off so that no light is emitted. This is known as clipping. Note that the dithering tones are not required to be sine waves. The dithering tones can vary in frequency, or can cover a range of frequencies. Dithering tones can also carry information. In other words, a signal emitted by one of the signal lasers can function as both a dithering tone and an information carrier.

Dithering tones and signal bands are chosen such that, for each laser, the cross products of the dithering tone and the payload signal or signal band emitted by that laser do not fall within the signal bands of any of the lasers in the PON. Otherwise, dithering induced distortion, including clipping-induced impulse noise, will cause errors to occur within data transmitted across the PON. Mathematically, this means that for each laser, the frequency of the dithering tone of that laser, plus or minus the frequency of the signal band for that laser, is not within any of the signal bands of any of the lasers in the PON. The frequency and/or intensity of the dithering tone may either remain constant or vary.

In addition, dithering tones for each laser are chosen such that the dithering tone for each laser within the PON is unique with respect to the dithering tones of the other lasers within the PON. This is necessary because, where two or more lasers within a PON emit identical dithering tones, optical frequency fluctuations induced by the identical dithering tones will be correlated. For example, where the dithering tones are sine waves, and the same frequency is used for each dithering tone, then an amount of noise reduction will depend on the frequency of the sine wave and the relative delay between the beams' paths. If the difference in path length from the lasers to the receiver corresponds to an integral number of cycles of an identical dithering tone, then a particular tone might not give the desired performance improvement.

Figure 2B:
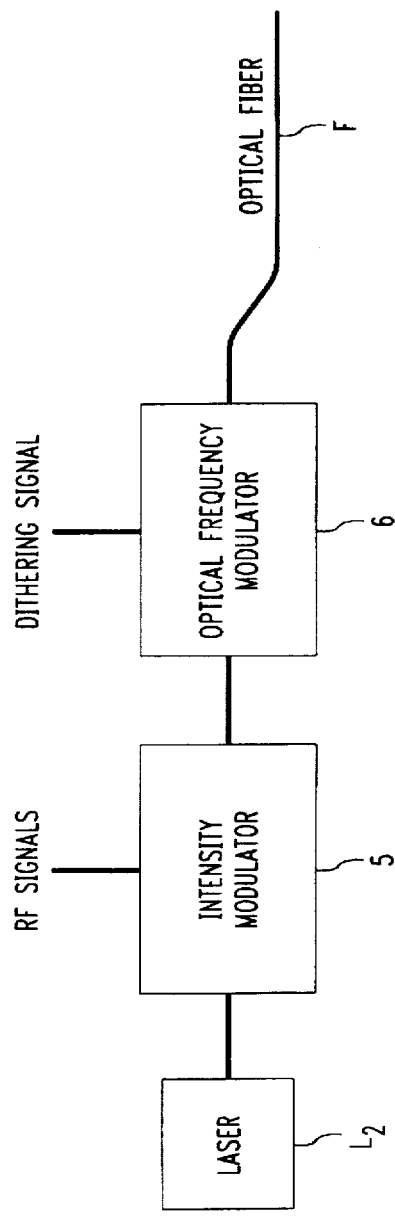
FIG. 2b shows a second embodiment of one of the transmitters of FIG. 1.

In another embodiment of the invention using the system shown in FIG. 1, externally modulated signal lasers are used instead of Fabry-Perot semiconductor lasers. In this embodiment, each transmitter includes an externally modulated signal laser, as shown in FIG. 2b. In FIG. 2b, the laser $L_2$ is connected to an intensity modulator 5 and an optical frequency modulator 6. The intensity modulator 5 modulates the intensity of light output from laser $L_2$ according to RF signals, and the optical frequency modulator modulates the optical frequency of the light output from laser $L_2$ according to a dithering signal. The resulting light is then emitted into optical fiber F.

Figure 3:
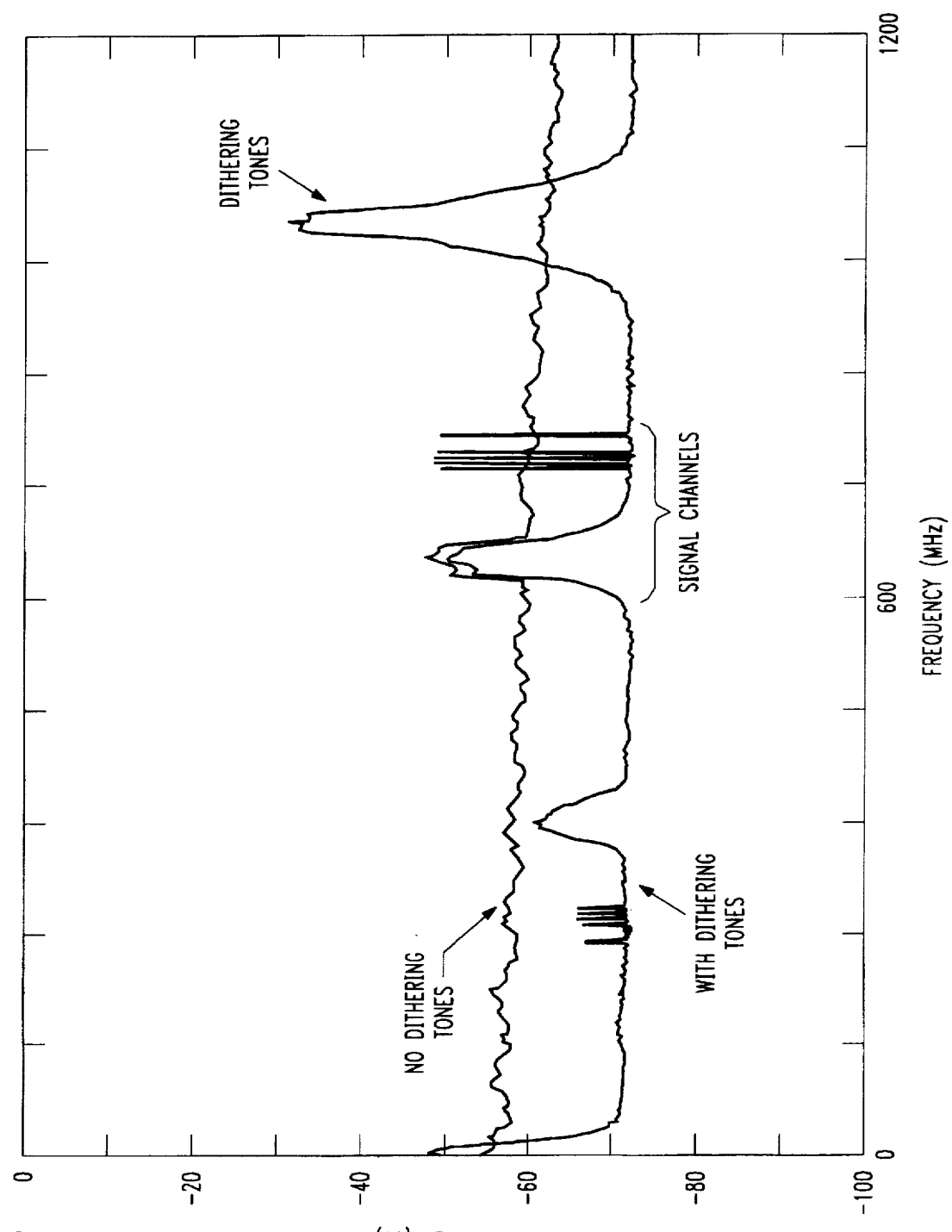
FIG. 3 shows radio frequency spectra in an optical network both with and without dithering tones.

FIG. 3 shows radio frequency spectra of an optical network according to an embodiment of the invention both with and without dithering tones. As shown in FIG. 3, signal channels span from 600 MHz to about 780 MHz, and the dithering tones fall between 990 MHz and 1010 MHz. Different dithering tones are applied to each laser. A first laser has a sine wave at 1000 MHz. The dithering tone of a second laser is white noise filtered to fall between 990 and 1010 MHz. As can be seen from FIG. 3, the dithering tones' OMD is much greater than that of the signal channels. The OMD of each dithering tone is 1.4, and the OMD of the signal channels is less than 1. Cross products of the dithering tones and the signal channels lie outside the signal channels between approximately 210 MHz and 410 MHz.

While this invention has been described in conjunction with the above outlined specific embodiments thereof, it is evident that many alternatives, modifications and variations will be apparent to those skilled in the art. Accordingly, the preferred embodiments of the inventions as set forth above are intended to be illustrative, not limiting. Various changes may be made without departing from the scope and spirit of the invention.

What is claimed is:

1. A method for reducing the effects of optical beat interference within an optical transmission system having at least two signal lasers and at least one signal band per signal laser, comprising:
   outputting a dithering tone from each of the at least two signal lasers within the optical transmission system,
   wherein an optical modulation depth of each dithering tone is greater than one.

2. The method of claim 1, wherein the optical modulation depth is about 1.4.

3. The method of claim 1, wherein the dithering tone output from each one of the at least two signal lasers is unique with respect to the dithering tones output from the other ones of the at least two signal lasers.

4. The method of claim 1, wherein cross products of each dithering tone and the at least one signal band of each signal laser fall outside all signal bands of the at least two signal lasers.

5. The method of claim 1, wherein the dithering tone output from each one of the at least two signal lasers is unique with respect to the dithering tones output from the other ones of the at least two signal lasers, and
   cross products of each dithering tone and the at least one signal band of each signal laser fall outside all signal bands of the at least two signal lasers.

6. The method of claim 1, wherein the optical transmission system is a passive optical network.

7. A method for reducing the effects of optical beat interference within an optical transmission system having at least two signal lasers and at least one signal band per signal laser, comprising:
   outputting a dithering tone from each of the at least two signal lasers within the optical transmission system,
   wherein cross products of each dithering tone and the at least one signal band of each signal laser fall outside all signal bands of the at least two signal lasers.

8. The method of claim 7, wherein the dithering tone output from each one of the at least two signal lasers is unique with respect to the dithering tones output from the other ones of the at least two signal lasers.

9. The method of claim 7, wherein the the optical transmission system is a passive optical network.

10. A method for reducing the effects of optical beat interference within an optical transmission system having at least two signal lasers and at least one signal band per signal laser, comprising:
    outputting a dithering tone from each of the at least two signal lasers within the optical transmission system,
    wherein the dithering tone output from each one of the at least two signal lasers is unique with respect to the dithering tones output from the others of the at least two signal lasers.

11. The method of claim 10, wherein the the optical transmission system is a passive optical network.

12. A system for transmitting lightwave signals within a signal band comprising:

a laser for generating the lightwave signals;

means connected to the laser for directing and carrying the lightwave signals; and means for modulating a frequency of light emitted by the laser to generate a dithering tone and for avoiding adverse effects of optical beat interference, wherein cross products of the dithering tone and the lightwave signals generated by the laser fall outside all signal bands of the laser.

13. The system of claim 12, wherein the dithering tone has an optical modulation depth greater than one.

14. The system of claim 13, wherein the optical modulation depth is about 1.4.

15. The system of claim 12, wherein the system is a passive optical network.

16. A system for transmitting lightwave signals within a plurality of signal bands comprising:

a plurality of lasers for generating the lightwave signals;

means connected to each of the plurality of lasers for directing and carrying the lightwave signals; and means for modulating a frequency of light emitted by each of the plurality of lasers to generate a dithering tone for each laser for avoiding adverse effects of optical beat interference, wherein cross products of each dithering tone and the lightwave signals emitted by the lasers associated with the dithering tones fall outside a plurality of signal bands of the plurality of lasers.

17. The system of claim 16, wherein each dithering tone has an optical modulation depth greater than one.

18. The system of claim 17, wherein the optical modulation depth is about 1.4.

19. The system of claim 16, wherein the dithering tone of each one of the plurality of lasers is unique with respect to the dithering tones of the other ones of the plurality of lasers.

20. The system of claim 16, wherein each of the plurality of lasers is a semiconductor laser.

21. The system of claim 16, wherein each dithering tone has an optical modulation depth greater than one, and the dithering tone of each one of the plurality of lasers is unique with respect to the dithering tones of the other ones of the plurality of lasers.

22. A system for transmitting lightwave signals within a plurality of signal bands comprising:

a plurality of lasers for generating the lightwave signals;

means connected to each of the plurality of lasers for directing and carrying the lightwave signals; and means for modulating a frequency of light emitted by each of the plurality of lasers to generate a dithering tone for each laser for avoiding adverse effects of optical beat interference, wherein each dithering tone has an optical modulation depth greater than one.

23. The system of claim 22, wherein the dithering tone of each one of the plurality of lasers is unique with respect to the dithering tones of the other ones of the plurality of lasers.

24. A system for transmitting lightwave signals within a plurality of signal bands comprising:

a plurality of lasers for generating the lightwave signals;

means connected to each of the plurality of lasers for directing and carrying the lightwave signals; and means for modulating a frequency of light emitted by each of the plurality of lasers to generate a dithering tone for each laser for avoiding adverse effects of optical beat interference, wherein the dithering tone of each one of the plurality of lasers is unique with respect to the dithering tones of the other ones of the plurality of lasers.

\* \* \* \* \*